United States Patent
Maeda et al.

(10) Patent No.: US 9,156,632 B2
(45) Date of Patent: *Oct. 13, 2015

(54) CONVEYING APPARATUS

(71) Applicant: SINFONIA TECHNOLOGY CO., LTD., Tokyo (JP)

(72) Inventors: Minoru Maeda, Tokyo (JP); Yosuke Muraguchi, Tokyo (JP); Mamoru Kosaki, Tokyo (JP); Takashi Fujiwara, Tokyo (JP)

(73) Assignee: SINFONIA TECHNOLOGY CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/970,375

(22) Filed: Aug. 19, 2013

(65) Prior Publication Data

US 2014/0054136 A1    Feb. 27, 2014

(30) Foreign Application Priority Data

Aug. 21, 2012 (JP) ................................ 2012-182091

(51) Int. Cl.
| | |
|---|---|
| *H01L 21/67* | (2006.01) |
| *B65G 54/02* | (2006.01) |
| *H02K 41/02* | (2006.01) |
| *H02K 41/03* | (2006.01) |
| *H01L 21/677* | (2006.01) |
| *H02K 5/128* | (2006.01) |

(52) U.S. Cl.
CPC .......... *B65G 54/02* (2013.01); *H01L 21/67709* (2013.01); *H02K 5/128* (2013.01); *H02K 41/02* (2013.01); *H02K 41/031* (2013.01)

(58) Field of Classification Search
CPC ........... H01L 21/67709; H02K 41/031; H02K 5/128; H02K 41/02; B65G 25/04; B65G 54/02
USPC ......................................... 198/619
See application file for complete search history.

(56) References Cited

U.S. PATENT DOCUMENTS

| | | | | |
|---|---|---|---|---|
| 5,641,054 | A * | 6/1997 | Mori et al. ................... | 198/619 |
| 5,838,079 | A * | 11/1998 | Morohashi et al. ........ | 310/12.24 |
| 6,326,708 | B1 * | 12/2001 | Tsuboi et al. .............. | 310/12.06 |
| 6,348,746 | B1 * | 2/2002 | Fujisawa et al. ........... | 310/12.24 |
| 6,873,404 | B2 * | 3/2005 | Korenaga ...................... | 355/72 |
| 7,211,908 | B2 * | 5/2007 | Tamaki ...................... | 310/12.25 |

(Continued)

FOREIGN PATENT DOCUMENTS

JP    2010-41889 A    2/2010

*Primary Examiner* — Gene Crawford
*Assistant Examiner* — Thomas Randazzo
(74) *Attorney, Agent, or Firm* — Knobbe Martens Olson & Bear LLP

(57) ABSTRACT

To provide a conveying apparatus that includes: a fixed section; a movable section movable with respect to the fixed section; and a pair of linear motors each located so as to be partially included in the fixed section and the movable section. Each linear motor includes a primary magnetic pole section and a secondary magnetic pole section, and these pole sections are arranged to face each other so as to enable the movable section to move with respect to the fixed section. The movable section includes a movable body capable of conveying a conveyed object, and one of the magnetic pole sections of each linear motor. Each linear motor is located at each of opposite ends of the movable body in a width direction that is orthogonal to a moving direction, and the fixed section includes the other of the magnetic pole sections.

8 Claims, 4 Drawing Sheets

(56) References Cited

U.S. PATENT DOCUMENTS

| | | | |
|---|---|---|---|
| 7,226,270 B2* | 6/2007 | Hwang et al. | 414/749.1 |
| 7,633,188 B2* | 12/2009 | Kitade et al. | 310/12.23 |
| 7,859,142 B2* | 12/2010 | Armeit et al. | 310/12.24 |
| 7,888,827 B2* | 2/2011 | Kaneshige et al. | 310/12.21 |
| 8,330,307 B2* | 12/2012 | Nagasaka | 310/12.29 |
| 8,368,254 B2* | 2/2013 | Hanamura et al. | 310/12.02 |
| 8,522,958 B2* | 9/2013 | Tobe et al. | 198/619 |
| 2006/0012251 A1* | 1/2006 | Miyata et al. | 310/12 |
| 2009/0191030 A1* | 7/2009 | Bluck et al. | 414/217 |
| 2010/0036523 A1* | 2/2010 | Sato et al. | 700/228 |
| 2012/0247925 A1* | 10/2012 | Cooke | 198/617 |
| 2013/0228415 A1* | 9/2013 | Iwasaki et al. | 198/339.1 |

* cited by examiner

CONVEYING APPARATUS

CROSS-REFERENCE TO RELATED APPLICATIONS

This application claims the benefit of Japanese Patent Application No. 2012-182091, the contents of which are incorporated herein by reference.

FIELD

The present invention relates to a conveying apparatus driven by a linear motor.

BACKGROUND

Citation List

Patent Literature

Patent Literature: Japanese Patent Application Laid-Open No. 2010-41889

A conveying apparatus driven by a linear motor is widely known. An example of such a conveying apparatus is described in Patent Literature 1. A movable section of the conveying apparatus, on which a conveyed object is mountable, is movable (specifically reciprocatable) in the longitudinal direction of the conveying apparatus. A primary magnetic pole section, which projects upward and extends in the longitudinal direction of the movable section, is provided on the bottom surface of a housing of the conveying apparatus. Further, the movable section is provided with secondary magnetic pole sections which project downward, extend in the longitudinal direction of the movable section and located so as to hold therebetween the primary magnetic pole section from the opposite sides in the width direction of the movable section.

In the conveying apparatus described in Patent Literature 1, the single primary magnetic pole section is located at the center in the width direction of the housing, and the secondary magnetic pole sections are located so as to hold therebetween the primary magnetic pole section from the opposite sides in the width direction of the movable section. Therefore, it is necessary that a space, through which the secondary magnetic pole sections can pass, is secured on the opposite outer sides of the primary magnetic pole section in the width direction over the movable range of the movable section. For this reason, the utilization of the central space inside the housing is restricted.

As described above, the utilization of the central space inside the housing is restricted, and hence when various units, such as sensors, and a unit for lifting a conveyed object on the table, are to be arranged, these units may be subjected to restriction in space in which they arrangeable.

SUMMARY

Accordingly, an object of the present invention is to provide a conveying apparatus in which the space used for arranging various units is less restricted.

According to the present invention, there is provided a conveying apparatus, which includes:
a fixed section;
a movable section movable with respect to the fixed section; and
a pair of linear motors each located so as to be partially included in the fixed section and the movable section, wherein each of the linear motors includes a primary magnetic pole section and a secondary magnetic pole section, and the primary magnetic pole section and the secondary magnetic pole section are arranged to face each other so as to enable the movable section to move with respect to the fixed section, the movable section includes a movable body capable of conveying a conveyed object, and one of the primary magnetic pole section and the secondary magnetic pole section of each of the pair of linear motors, each of the pair of linear motors being located at each of opposite ends of the movable body in a width direction that is orthogonal to a moving direction, and the fixed section includes the other of the primary magnetic pole section and the secondary magnetic pole section.

Note that the term "opposite ends" includes not only end edge positions but also positions in the vicinity of end edge.

The secondary magnetic pole section of each of the pair of linear motors may include a permanent magnet at a position facing the primary magnetic pole section.

Further, the conveying apparatus may be configured so that the fixed section includes a supporting section which supports the movable section from below, the supporting section includes a guide section which regulates the moving direction of the movable section and extends in a longitudinal direction, the movable section includes a guided section which is movable while being engaged with the guide section, and a load reduction mechanism, which presses the movable section upward with magnetic repulsion force or magnetic attraction force to thereby reduce weight load applied to the guide section and the guided section, is provided at a position directly above or directly below the guide section and the guided section.

Note that the term "directly above" or "directly below" described above includes not only a vertically above or below position but also a position in the vicinity of the vertically above or below position.

Further, the conveying apparatus may be configured so that the guide section and the guided section are located at opposite ends in the width direction of the fixed section and the movable section, and the movable section includes mounting sections located outside or inside of the guide section and the guided section in the width direction, the mounting sections being for attaching one of the primary magnetic pole section and the secondary magnetic pole section.

BRIEF DESCRIPTION OF DRAWINGS

The foregoing and other features of the present invention will become apparent from the following description and drawings of an illustrative embodiment of the invention in which.

DESCRIPTION OF EMBODIMENTS

An embodiment according to the present invention will be described below with reference to the drawings. As for the directions, the following description is given under the assumption that the direction coincident with the long-side direction of a housing 1 is the longitudinal direction, and that the direction orthogonal to the longitudinal direction is the width direction. Note that the vertical and horizontal directions are based on the state of the present embodiment. However, for example, an embodiment, in which the upper and lower sides are reversed with respect to the state of the present embodiment (that is, an embodiment in which a conveyed object is hung and conveyed), can also be implemented. Therefore, the present invention is not limited to the form shown in the directions of the present embodiment. Further, as for the inner and outer directions, the description is given under the assumption that the direction directed toward the center in the width direction of the housing 1 is the inner direction, and that, on the contrary, the direction away from the center in the width direction of the housing 1 is the outer direction.

Figure 1:
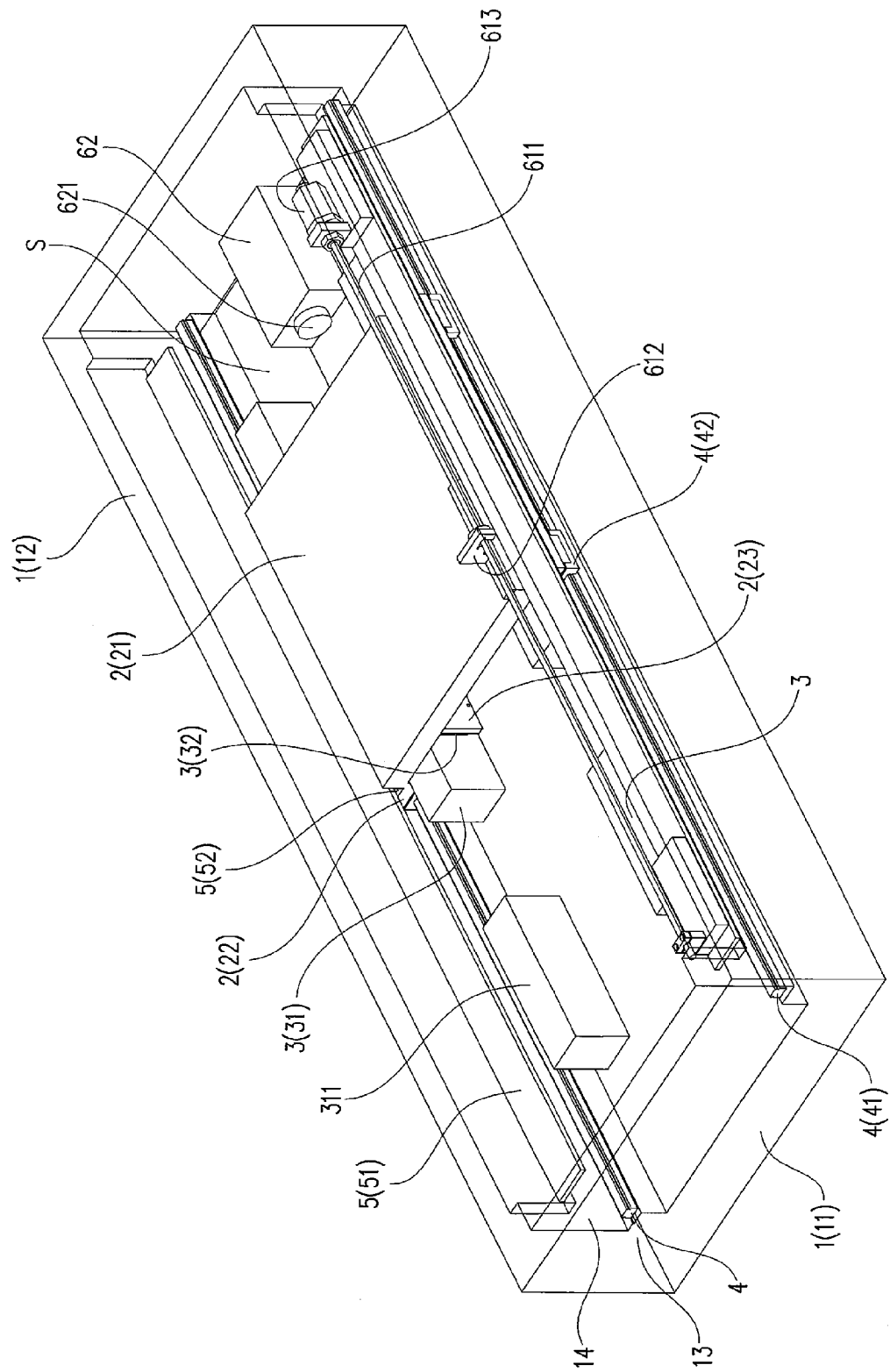
FIG. 1 is a perspective view showing a conveying apparatus of a present embodiment.
Figure 2:
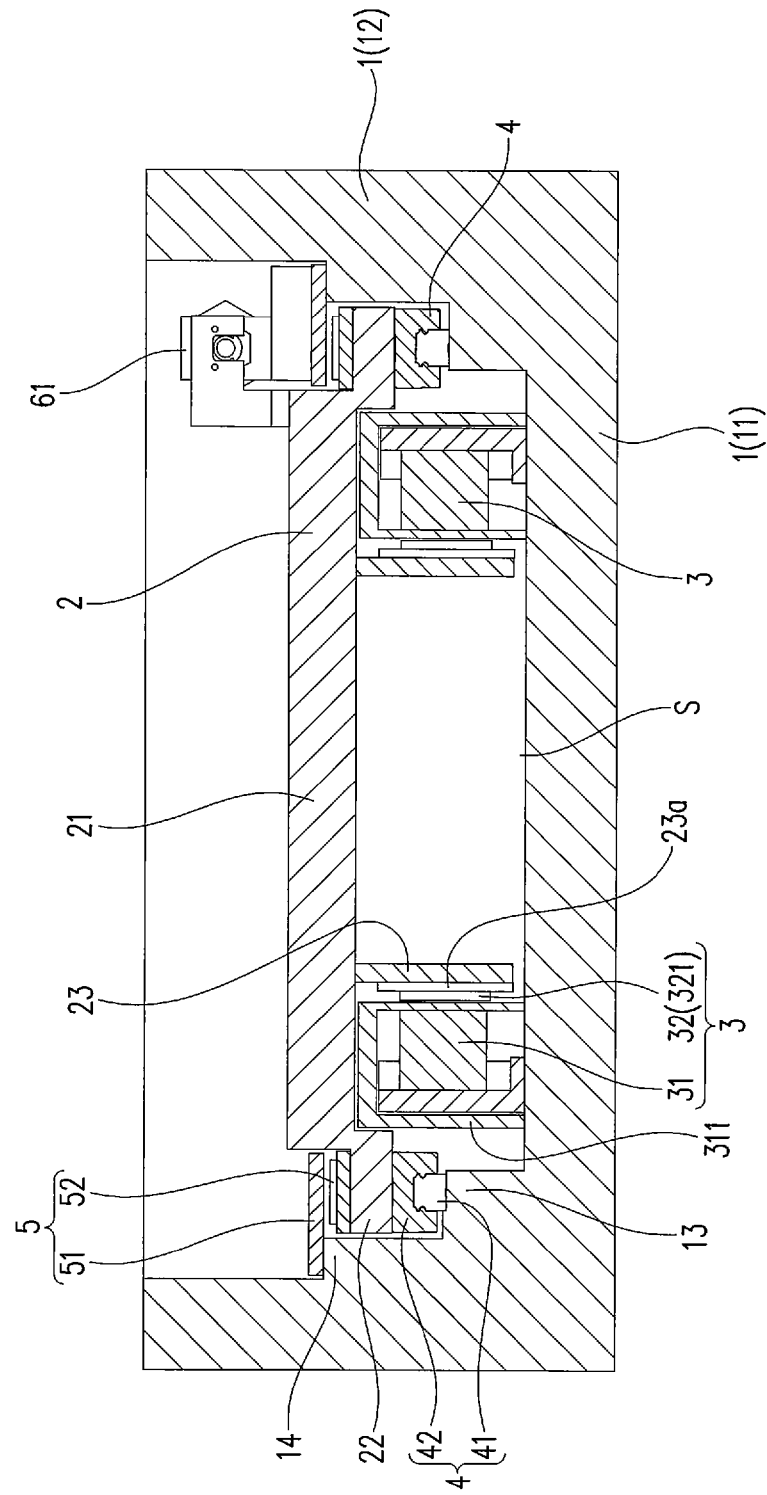
FIG. 2 is a longitudinal sectional view showing the conveying apparatus of the present embodiment.

As shown in FIG. 1 and FIG. 2, a conveying apparatus of the present embodiment includes a housing 1, a conveying table 2, a linear motor 3, a linear guide 4, and a load reduction mechanism 5. Each of the components is arranged to be line-symmetrical with respect to the center in the width direction of the housing 1.

The housing 1 functions as a fixed section and has a rectangular parallelepiped box-like external shape. Note that the fixed section is composed of the housing 1, a part of the linear motor 3, a part of the linear guide 4, and a part of the load reduction mechanism 5. The housing 1 includes a bottom wall section 11 located on the lower side thereof, side wall sections 12 located on the four sides thereof, and a top wall section (not shown for the purpose of description) located on the upper side thereof. Primary magnetic pole sections 31, each of which constitutes the linear motor 3, are arranged on the upper surface of the bottom wall section 11. Further, the side wall section 12 is provided with a step section which has an upward facing surface extending in the longitudinal direction. The step section is composed of two portions, upper and lower, of a lower step section 13 and an upper step section 14. The lower step section 13 functions as a supporting section which supports the conveying table 2 from below the conveying table 2. A guide rail 41, which constitutes the linear guide 4, is arranged on the upper surface of the lower step section 13. Further, an attraction plate 51, which constitutes the load reduction mechanism 5, is arranged on the upper surface of the upper step section 14.

A processing chamber, which has a surrounded space and extends in the longitudinal direction, is formed by the wall sections. In the present embodiment, the bottom wall section 11 and the side wall section 12 are integrally formed of an aluminum alloy, and the wall sections are air-tightly combined with each other. Therefore, the processing chamber can be maintained in a vacuum state or a pressure-reduced state.

The conveying table 2 functions as a movable body in the movable section provided to be movable with respect to the fixed section. The conveying table 2 is located at an upper portion of the housing 1 (specifically above the bottom wall section 11). Note that the movable section is composed of the conveying table 2, a part of the linear motor 3, a part of the linear guide 4, and a part of the load reduction mechanism 5, and is movable in the longitudinal direction. The conveying table 2 is movable (specifically reciprocatable) in the longitudinal direction in the housing 1 by being driven by the linear motor 3. The conveying table 2 includes a mounting section 21 located on the central side in the width direction, and supported sections 22 respectively located on opposite sides of the conveying table 2 in the width direction. A conveyed object, such as an electronic component (for example, a silicon wafer), is mounted on the upper surface of the mounting section 21 so as to be conveyed. Incidentally, the longitudinal dimension of the conveying table 2 is set according to the dimension of the conveyed object. A unit, such as, for example, a robot arm, which can perform operations, such as operations of moving, lifting, rotating the conveyed object on the conveying table 2, may be arranged at the mounting section 21. Further, the supported section 22 is formed to be lower by one step than the mounting section 21. The linear guide 4 is located under the supported section 22, and the load reduction mechanism 5 is located above the supported section 22.

The conveying table 2 includes, at each of opposite ends thereof in the width direction, a secondary support bracket 23 as a mounting section for supporting a secondary magnetic pole section 32 which constitutes the linear motor 3. The secondary support bracket 23 is formed in a plate shape so as to extend downward from the lower surface of the mounting section 21. Further, the conveying table 2 includes, at each position on the outside of the secondary support bracket 23 in the width direction, a guide block 42 which constitutes the linear guide 4. Further, a permanent magnet 52, which constitutes the load reduction mechanism 5, is attached to the upper surface of each of the opposite ends of the conveying table 2 in the width direction. Further, a part of a sensor for detecting the longitudinal position of the conveying table 2 is provided on the upper surface of the conveying table 2. In the present embodiment, this part is a magnet section 612 of a magnetostrictive sensor 61. Note that, as shown in FIG. 1, the magnetostrictive sensor 61 can detect the longitudinal position of the magnet section 612 (that is, the longitudinal position of the conveying table 2) in such a manner that torsional distortion, which is imparted by the magnet section 612 to a magnetostrictive line section 611 that is provided at the housing 1 so as to extend in the longitudinal direction, is detected by a detecting section 613 located at one end of the magnetostrictive line section 611. Further, a power supply mechanism (not shown) for supplying electric power to a unit such as a robot arm, is provided, as required, on the conveying table 2.

Next, the linear motor 3 will be described. The linear motor 3 is configured between the fixed section and the movable section (so as to straddle between the fixed section and the movable section). The linear motor 3 of the present embodiment is a synchronous linear motor in which a permanent magnet is used on the secondary side. The linear motor 3 is composed of the primary magnetic pole section 31 which is formed in a row so as to linearly extend in the longitudinal direction, and the secondary magnetic pole section 32 which is located in parallel with the primary magnetic pole section 31 and formed in a row so as to linearly extend in the longitudinal direction. That is, the linear motor 3 includes the primary magnetic pole section 31 and the secondary magnetic pole section 32. Further, the primary magnetic pole section 31 and the secondary magnetic pole section 32 are arranged to face each other so as to enable the movable section to move with respect to the fixed section. That is, the primary magnetic pole section 31 and the secondary magnetic pole section 32 are arranged to face each other so that the propulsive force generated by the linear motor 3 acts to move the conveying table 2 in the longitudinal direction.

The housing 1 is provided with the primary magnetic pole section 31, and the conveying table 2 is provided with the secondary magnetic pole section 32. Further, a pair of the linear motors 3 and 3 are located so as to respectively coincide with opposite ends in the width direction (left and right ends in FIG. 2) of the conveying table 2. That is, the conveying apparatus of the present embodiment includes two linear motors 3 per one conveying table 2: one at one end in the width direction, and one at the other end.

Although not shown, the primary magnetic pole section 31 includes a core and a coil wound around the core. Note that the primary magnetic pole section 31 can also be configured to include only a coil without a core. The combination of coil and core is arranged in a row so as to correspond to the order of three phases U, V, W of AC, and magnetic flux mainly directed toward the inner side in the width direction is generated when the coil is energized. The core and the coil are covered with a cover 311 formed of a nonmagnetic body, such as a stainless alloy. When the conveying apparatus is used in a vacuum environment or in a reduced-pressure environment, the cover 311 functions as a partition wall between the vacuum (reduced-pressure) region and an atmospheric region. As shown in FIG. 1, the primary magnetic pole sections 31 are intermittently arranged in the longitudinal direction. Further, as shown in FIG. 1 and FIG. 2, the primary magnetic pole sections 31 are arranged so as to face each other in the width direction.

The secondary magnetic pole section 32 is composed of a plurality of permanent magnets 321 each fixed to the secondary support bracket 23 via a spacer 23a. The plurality of permanent magnets 321 are arranged so that the N pole and the S pole of the magnetic poles exposed in the inner direction are adjacent each other in the longitudinal direction. The secondary magnetic pole section 32 is located inwardly from the primary magnetic pole section 31 to face the primary magnetic pole section 31 so as to maintain a predetermined interval (gap) between the magnetic pole sections. That is, the secondary magnetic pole section 32 is provided with the permanent magnets 321 at positions respectively facing the primary magnetic pole sections 31.

Here, some conventional conveying apparatuses are configured such that one secondary magnetic pole section is held between primary magnetic pole sections from the opposite sides in the width direction of the secondary magnetic pole section. In the secondary magnetic pole section in this conveying apparatus, it is necessary that the magnetic flux generated from the secondary magnetic pole section is directed toward opposite sides in the width direction (for example, in the left and right direction). For this reason, when the secondary magnetic pole section is formed by using permanent magnets, it is necessary that the same magnetic poles are bonded to each other. However, this bonding work needs to be performed under the action of magnetic repulsion force, and hence the working efficiency is not high.

On the contrary, the secondary magnetic pole section 32 of the present embodiment can be manufactured only by arranging side by side the permanent magnets 321 along the longitudinal direction. For this reason, it is not necessary as described above, to perform the work of bonding the same magnetic poles of permanent magnets to each other under the action of magnetic repulsion force. Therefore, the working efficiency at the time of manufacturing the secondary magnetic pole section 32 is high.

The single linear motor 3 is composed of the primary magnetic pole section 31 and the secondary magnetic pole section 32. A pair of the linear motors 3 are located so as to be separated from each other in the width direction. Thereby, as shown in FIG. 2, a space S can be secured at the center of the housing 1 and under the conveying table 2. In the present embodiment, as shown in FIG. 1, a sensor (laser sensor 62) for detecting the longitudinal position of the conveying table 2 is provided in the space S secured in this way. In order to reflect laser light irradiated from a laser irradiation section 621 of the laser sensor 62 and to make the reflected light return to the laser sensor 62, a reflection mirror section (not shown) is provided under the mounting section 21 of the conveying table 2. The reflection mirror section includes a reflection surface which faces the laser irradiation section 621. Note that the laser sensor 62 is a sensor different from the magnetostrictive sensor 61. In the present embodiment, the longitudinal position of the conveying table 2 is mainly detected by the laser sensor 62, and the magnetostrictive sensor 61 is used as a backup sensor. The space S can be secured under the conveying table 2 in this way, and hence the flexibility at the time of arranging various components of the conveying apparatus can be increased.

Further, in the single linear motor 3, the primary magnetic pole section 31 and the secondary magnetic pole section 32 face each other at one position at which the surfaces of the magnetic pole sections 31 and 32 face each other. Therefore, it is easy to perform the work of setting, to an appropriate value, the interval (gap) between the primary magnetic pole section 31 and the secondary magnetic pole section 32, as compared with the conventional configuration in which the secondary magnetic pole section is located on the opposite sides in the width direction of the primary magnetic pole section.

Further, the driving force for moving the conveying table 2 is generated at opposite end portions in the width direction of the conveying table 2, and hence the generation source of the force of bending the conveying table 2 is distributed without being concentrated. Thereby, it is possible to reduce the bending of the conveying table 2.

As shown in FIG. 2, the linear guide 4 is configured such that the guide block 42 fixed to the conveying table 2 as a guided section straddles the guide rail 41 as a guiding section provided on the side of the housing 1 so as to extend in the longitudinal direction of the housing 1. With this configuration, the moving direction of the conveying table 2 is regulated.

Ball bearings (not shown) are located between the guide rail 41 and the guide block 42, so that the guide block 42 can be moved along the guide rail 41 with small resistance. The linear guide 4 is located on the outer side in the width direction of the linear motor 3.

The linear motor 3 and the linear guide 4 can be arranged closer to each other as compared with the conventional configuration in which the linear motor 3 is provided at the center of the housing 1. Thereby, the displacement of the conveying table 2, which is generated by the propulsive force of the linear motor 3, can be reduced. Therefore, the load applied to the linear guide 4 (especially, to the ball bearings) can be reduced. Particularly, in the conveying apparatus used in a vacuum environment or in a reduced pressure environment, oilless bearings having durability lower than that of bearings using lubricating oil are used in order to prevent contamination due to scattering of lubricating oil. Therefore, the life of the linear guide 4 can be extended by the load reduction.

The load reduction mechanism 5 includes the attraction plate 51 which is located on the side of the housing 1 and has a magnetic body, and the permanent magnet 52 which is located on the side of the conveying table 2. The attraction plate 51 is located above the permanent magnet 52. The load reduction mechanism 5 is located directly above the linear guide 4 (note that "directly above" in this specification conceptually includes not only a vertically above position but also a position in the vicinity of the vertically above position). In this configuration, the conveying table 2 is urged upward (directly upward) by the magnetic attraction force generated by the permanent magnet 52 to attract the attraction plate 51.

The weight load applied to the linear guide 4 is reduced by the amount corresponding to the urging force applied to the conveying table 2. For this reason, the load applied to the ball bearings of the linear guide 4 can be reduced and hence the life of the linear guide 4 can be extended. Further, in the load reduction mechanism 5, a permanent magnet is used, and thereby the configuration of the load reduction mechanism 5 can be simplified.

In the above, the present invention has been described by way of an embodiment. However, the present invention is not limited to the above-described embodiment, and various variations are possible within the scope and spirit of the present invention.

For example, in the conveying apparatus of the present embodiment, the processing chamber in the housing 1 is used in a vacuum environment or in a reduced pressure environment. However, the present invention is not limited to this, and the processing chamber in the housing 1 may be used in an atmospheric environment. Further, the processing chamber may also be used in an inert gas environment.

Figure 3:
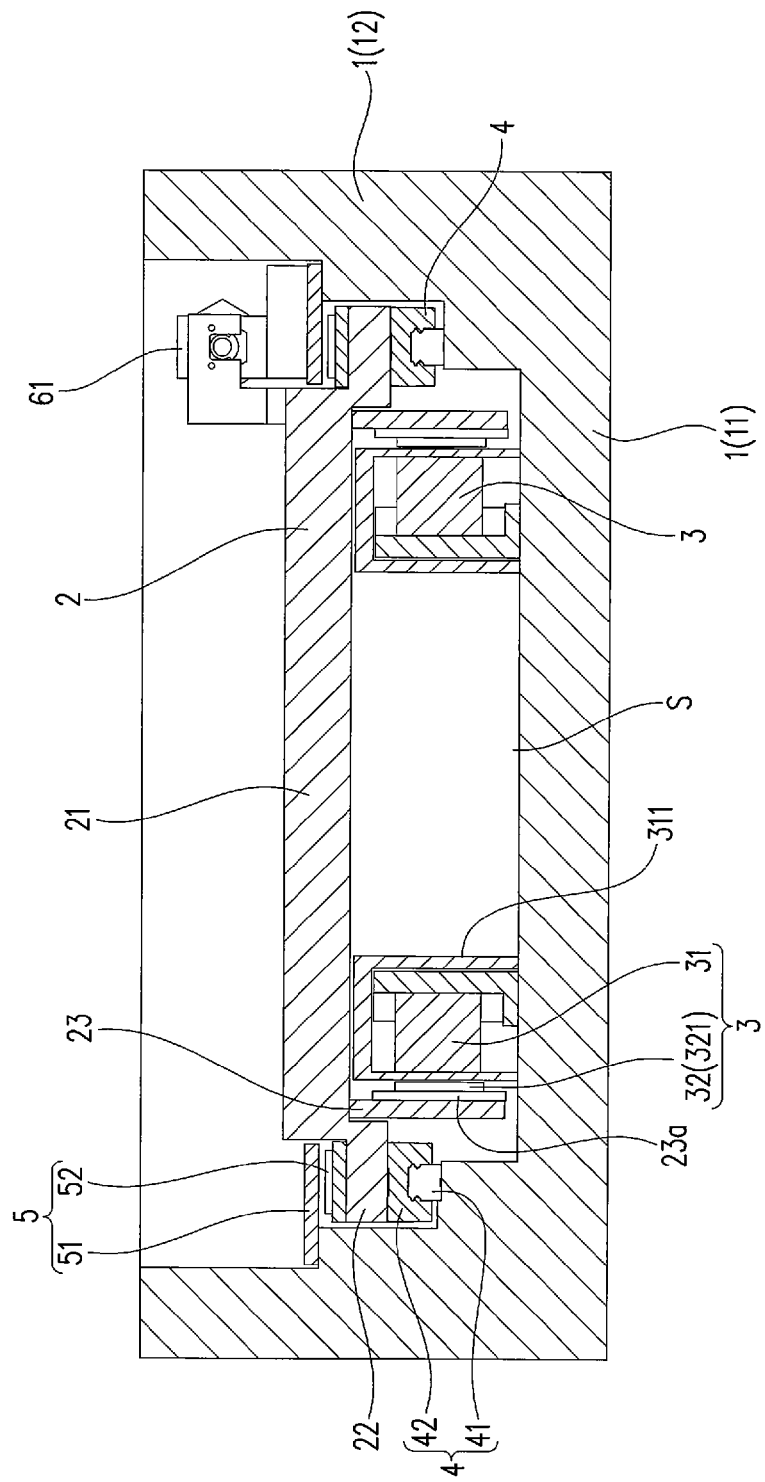
FIG. 3 is a longitudinal sectional view showing another embodiment.
Figure 4:
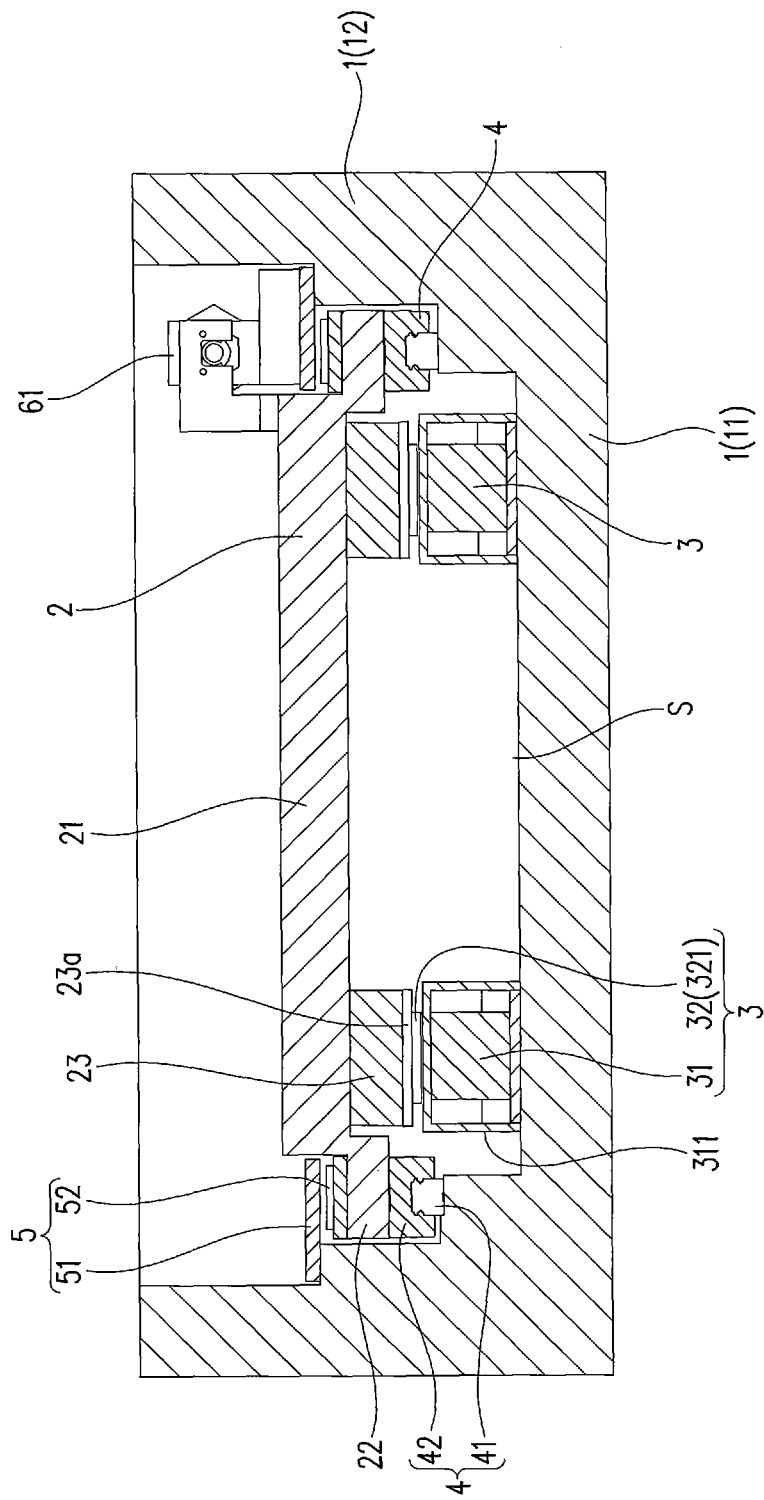
FIG. 4 is a longitudinal sectional view showing still another embodiment.

Further, in the present embodiment, the primary magnetic pole section 31 is located on the outer side in the width direction, and the secondary magnetic pole section 32 is located on the inner side in the width direction. However, as shown in FIG. 3, the primary magnetic pole section 31 may be located on the inner side, and the secondary magnetic pole section 32 may be located on the outer side. Further, in the present embodiment, the primary magnetic pole section 31 and the secondary magnetic pole section 32 are arranged side by side in the horizontal direction (left-right direction). However, as shown in FIG. 4, the primary magnetic pole section 31 and the secondary magnetic pole section 32 may be arranged side by side in the vertical direction.

Further, in the present embodiment, the housing 1 is provided with the primary magnetic pole section 31, and the conveying table 2 is provided with the secondary magnetic pole section 32. On the contrary, however, the housing 1 may be provided with the secondary magnetic pole section 32, and the conveying table 2 may be provided with the primary magnetic pole section 31.

Further, the primary magnetic pole sections 31 of the present embodiment are intermittently arranged in the longitudinal direction but may also be continuously arranged in the longitudinal direction. Further, the primary magnetic pole sections 31 of the present embodiment are arranged to be symmetrical with respect to the center line in the width direction but may also be arranged to be shifted to one side in the width direction. However, when the conveying apparatus is used in a vacuum environment or in a reduced pressure environment, the symmetrical arrangement is desirable in order to prevent each of the components from being unevenly deformed under reduced pressure.

Further, the secondary magnetic pole section 32 may also be provided with a core and a coil wound around the core.

Further, the load reduction mechanism 5 may be located directly below the linear guide 4 (note that the term "directly below" in this specification conceptually includes not only a vertically below position but also a position in the vicinity of the vertically below position). Further, for example, the same magnetic poles of permanent magnets may be made to face each other so that the conveying table 2 is urged upward by the magnetic repulsion force. Further, an electromagnet may also be used instead of the permanent magnet.

Further, the longitudinal direction in the present embodiment is a linear direction (direction along a straight line). However, the present invention is not limited to this, and the longitudinal direction may be a direction along a curved line when the housing 1 is formed to have a curved shape or an annular shape.

The above description is summarized as follows. The conveying apparatus according to the present embodiment is featured by including a fixed section (housing) 1, a movable section movable with respect to the housing 1, and a pair of linear motors 3 each located so as to be partially included in the housing 1 and the movable section, wherein each of the linear motors 3 includes a primary magnetic pole section 31 and a secondary magnetic pole section 32, and the primary magnetic pole section 31 and the secondary magnetic pole section 32 are arranged to face each other so as to enable the movable section to move with respect to the housing 1, the movable section includes a movable body (conveying table) 2 capable of conveying a conveyed object, and one of the primary magnetic pole section 31 and the secondary magnetic pole section 32 each located at opposite ends in the width direction that is orthogonal to the moving direction of the conveying table 2, and the housing 1 includes the other of the primary magnetic pole section 31 and the secondary magnetic pole section 32.

In this configuration, the movable section is provided, at opposite ends thereof in the width direction, with one of the primary magnetic pole section 31 and the secondary magnetic pole section 32 of each of the pair of linear motors 3. For this reason, the space S can be secured between one of the pair of linear motors 3 and the other of the pair of linear motors 3.

Further, the secondary magnetic pole section 32 can be provided with the permanent magnet 321 at a position facing the primary magnetic pole section 31. With this configuration, the secondary magnetic pole section 32 can be manufactured only by arranging side by side the permanent magnets 321 along the longitudinal direction. For this reason, when the secondary magnetic pole section 32 is manufactured, it is not necessary to perform the work of bonding the same magnetic poles of the permanent magnets to each other under the action of magnetic repulsion force, and hence the working efficiency is high.

Further, the housing 1 can include a supporting section which supports the movable section from below. The supporting section can include the guide section (guide rail) 41 which regulates the moving direction of the movable section and extends in the longitudinal direction. The movable section can include the guided section (guide block) 42 which can be moved while being engaged with the guide rail 41. The load reduction mechanism 5, which presses the movable section upward with magnetic repulsion force or magnetic attraction force to thereby reduce weight load applied to the guide rail 41 and the guide block 42, can be provided at a position directly above or directly below the guide rail 41 and the guide block 42.

In this configuration, the load reduction mechanism 5, which reduces weight load applied to the guide rail 41 and the guide block 42 by maintaining the vertical distance between the housing 1 and the movable section, is provided at a position directly above or directly below the guide rail 41 and the guide block 42. For this reason, the life of the guide rail 41 and the guide block 42 can be extended by reducing the weight load.

Further, the guide rail 41 and the guide block 42 can be located at each of the opposite ends in the width direction of the housing 1 and the movable section. The movable section can include mounting sections located outside or inside of the guide rail 41 and the guide block 42 in the width direction, the mounting sections being for attaching one of the primary magnetic pole section 31 and the secondary magnetic pole section 32.

In this configuration, the guide rail 41 and the guide block 42 can be made close to the mounting section, and thereby the displacement of the movable section due to the propulsive force of the linear motor 3 can be reduced. For this reason, the life of the guide rail 41 and the guide block 42 can be extended by reducing the load.

According to the present invention, it is possible to secure the space S between each pair of the linear motors 3. Thereby, it is possible to provide a conveying apparatus in which the restriction of space for arranging various apparatuses is reduced.

What is claimed is:

1. A conveying apparatus comprising:
a fixed section;
a movable section movable with respect to the fixed section; and
a pair of linear motors each located so as to be partially included in the fixed section and the movable section, wherein
the pair of the linear motors is located so as to be separated from each other in a width direction that is orthogonal to a moving direction,
each of the linear motors includes a primary magnetic pole section and a secondary magnetic pole section, the primary magnetic pole section comprises a coil, and the primary magnetic pole section and the secondary magnetic pole section are arranged to face each other so as to enable the movable section to move with respect to the fixed section,
the movable section includes a movable body capable of conveying a conveyed object, and the secondary magnetic pole section of each of the pair of linear motors, each of the pair of linear motors being located at each of opposite ends of the movable body in the width direction,
the fixed section includes the primary magnetic pole section and a supporting section which supports the movable section from below,
the supporting section includes a guide section which regulates the moving direction of the movable section and extends in a longitudinal direction,
the movable section includes a guided section which is movable while being engaged with the guide section,
one of the pair of the linear motors is located on one end side of the movable section in the width direction and the other is located on the other end side of the movable section in the width direction,
each of the linear motors is arranged exclusively at a position close to an inner surface of a housing in the width direction, the housing being a part of the fixed section, and
the supporting section is arranged adjacent to each of the linear motors and close to the inner surface of the housing in the width direction, and the guide section and the guided section are arranged in a vertical direction.

2. The conveying apparatus according to claim 1, wherein the secondary magnetic pole section of each of the pair of linear motors includes a permanent magnet at a position facing the primary magnetic pole section.

3. The conveying apparatus according to claim 1, wherein a load reduction mechanism, which presses the movable section upward with magnetic repulsion force or magnetic attraction force to thereby reduce weight load applied to the guide section and the guided section, is provided at a position directly above or directly below the guide section and the guided section.

4. The conveying apparatus according to claim 3, wherein the guide section and the guided section are located at opposite ends in the width direction of the fixed section and the movable section, and
the movable section includes mounting sections located outside or inside of the guide section and the guided section in the width direction, the mounting sections being for attaching one of the primary magnetic pole section and the secondary magnetic pole section.

5. The conveying apparatus according to claim 2, wherein the fixed section includes a supporting section which supports the movable section from below,
the supporting section includes a guide section which regulates the moving direction of the movable section and extends in a longitudinal direction,
the movable section includes a guided section which is movable while being engaged with the guide section, and
a load reduction mechanism, which presses the movable section upward with magnetic repulsion force or magnetic attraction force to thereby reduce weight load applied to the guide section and the guided section, is provided at a position directly above or directly below the guide section and the guided section.

6. The conveying apparatus according to claim 5, wherein the guide section and the guided section are located at opposite ends in the width direction of the fixed section and the movable section, and
the movable section includes mounting sections located outside or inside of the guide section and the guided section in the width direction, the mounting sections being for attaching one of the primary magnetic pole section and the secondary magnetic pole section.

7. The conveying apparatus according to claim 1, wherein the primary magnetic pole section and the secondary magnetic pole section are arranged side by side in a horizontal direction.

8. The conveying apparatus according to claim 1 used in a vacuum environment or in a reduced-pressure environment.

\* \* \* \* \*